(12) United States Patent
Enjalbert et al.

(10) Patent No.: US 8,890,606 B2
(45) Date of Patent: Nov. 18, 2014

(54) VOLTAGE SWITCHING CIRCUITRY, INTEGRATED DEVICE AND INTEGRATED CIRCUIT, AND METHOD OF VOLTAGE SWITCHING

(75) Inventors: Jerome Enjalbert, Fonsorbes (FR); Marianne Maleyran, Saubens (FR)

(73) Assignee: Freescale Semiconductor, Inc., Austin, TX (US)

( * ) Notice: Subject to any disclaimer, the term of this patent is extended or adjusted under 35 U.S.C. 154(b) by 18 days.

(21) Appl. No.: 13/876,531

(22) PCT Filed: Oct. 27, 2010

(86) PCT No.: PCT/IB2010/003227
§ 371 (c)(1),
(2), (4) Date: Mar. 28, 2013

(87) PCT Pub. No.: WO2012/056266
PCT Pub. Date: May 3, 2012

(65) Prior Publication Data
US 2013/0200944 A1  Aug. 8, 2013

(51) Int. Cl.
*G05F 1/10* (2006.01)
*G05F 3/02* (2006.01)
*H03K 17/10* (2006.01)

(52) U.S. Cl.
CPC .............. *H03K 17/102* (2013.01); *G05F 3/02* (2013.01)
USPC .......................................................... 327/543

(58) Field of Classification Search
USPC ......................................... 327/530, 534–543
See application file for complete search history.

(56) References Cited

U.S. PATENT DOCUMENTS

| | | | |
|---|---|---|---|
| 6,181,193 B1 | 1/2001 | Coughlin, Jr. | |
| 6,771,115 B2 * | 8/2004 | Nakano | 327/536 |
| 7,236,002 B2 | 6/2007 | Salzmann et al. | |
| 2002/0024070 A1 | 2/2002 | Fournel | |
| 2004/0125524 A1 | 7/2004 | Blyth | |
| 2007/0171696 A1 | 7/2007 | Dray et al. | |

OTHER PUBLICATIONS

International Search Report and Written Opinion correlating to PCT/IB2010/003227 dated Aug. 17, 2011.

* cited by examiner

*Primary Examiner* — Sibin Chen (57) ABSTRACT

A voltage switching circuitry comprises a switching arrangement with a given number N of switches in series between a first terminal receiving a first voltage and a second terminal receiving a second voltage. The first voltage level is higher than the second voltage level, and N is at least equal to 2. A voltage-by-N divider, having N−1 output taps, is arranged to divide the first voltage by N to a scaled down version of the first voltage having a voltage level below voltage max ratings of the switches. The N−1 output taps of the divider are arranged to respectively output N−1 third voltages having respective levels staged below the first voltage level. N−1 max voltage generators generate N−1 fourth voltages, respectively equal to the maximum of the second voltage and of each of the N−1 third voltages. A switch control unit generates N control signals using the N−1 fourth voltages. These N control signals have respective voltage levels staged between the first voltage level and the second voltage level. In addition, each of the N control signals controls one of the switches of the switching arrangement, respectively.

20 Claims, 5 Drawing Sheets

VOLTAGE SWITCHING CIRCUITRY, INTEGRATED DEVICE AND INTEGRATED CIRCUIT, AND METHOD OF VOLTAGE SWITCHING

FIELD OF THE INVENTION

This invention relates to a voltage switching circuitry, an integrated device and an integrated circuit, and a method of voltage switching.

BACKGROUND OF THE INVENTION

For cost reasons, the choice of semiconductor technology for mixed-signal Integrated Circuits (IC) is often made in favour of Low Voltage (LV), Dual Gate Oxide (DGO) process technologies derived from dense, mainstream digital semiconductor technologies Like all electrical and electronic components, DGO MOS (Metal Oxide Semiconductor) transistors are limited in the amounts of voltage they can handle without sustaining damage. In particular DGO MOS transistors are rated for the maximum allowable voltage across their gate oxide layer, and across their channel region. This yields in technology voltage max ratings, commonly referred to as VGSmax and VDSmax, respectively, in the IC datasheet.

For example, the 0.18 um Mixed-Signal semiconductor technology as used by Taiwan Semiconductor Manufacturing Company Limited of Hinsui Taiwan, hereinafter TSMC, offers 1.8V rated MOS transistors for core logic and LV analog functions, and 3.6V rated MOS transistors for I/Os and Medium Voltage (MV) analog functions.

Some ICs, however, may embed functions which require a High Voltage (HV) which may exceed the technology max ratings. For instance, an IC having a Non Volatile Memory (NVM) requires an external HV supply for the NVM programming. Typically, the HV supply is only present on a HV pad of the circuit during NVM programming. The rest of the time, the pad is not driven externally (i.e., it is unconnected). When applied, the HV supply must be selectively routed from the HV pad to the VPP terminal of the NVM block in the circuit. This is to be achieved by an appropriate voltage switching circuitry using devices of LV or MV technology.

Some solutions may imply using MV devices out of their Safe Operating Areas (SOA). Yet, overvoltage conditions result in damage to transistors, causing permanent leakage. The leakage can be reduced to acceptable values by decreasing the voltage and time applied for NVM programming. Due to this issue, the programming voltage and duration have to be adjusted to get the best possible trade-off between transistor reliability and NVM data retention efficiency. In some applications, however, the leakage has to be very low and the delicate and risky adjustments have to be avoided.

Known solutions use modified devices that are not in the regular Process Development Kit (PDK) for the respective semiconductor technology. U.S. Pat. No. 7,236,002 discloses an electronic system for combined usage at differing voltage ranges as defined by a low-voltage range for operating standard CMOS devices and a high voltage range exceeding said standard CMOS low-voltage operating range significantly by multiples and thus necessarily utilizing input ports with an intrinsic high-voltage protection feature. The proposed structure is based on a digital CMOS input with N-channel extended drain transistor for high voltage protection. However, such a transistor extended-drain realization for CMOS transistor is not supported in all low cost technology PDK's.

U.S. Pat. No. 6,181,193 proposes a high voltage tolerant CMOS input/output interface circuit. In this circuit, a process feature called "dual-gate" or "thickoxide" process is used on any devices that will be exposed to high voltage. The thick-oxide devices have a larger capacitance and lower bandwidth, and therefore, preferably, they are only used where exposure to high voltage can cause damage. The remaining devices on the interface circuit may all use a standard process with the thinner oxide, allowing the I/O and the core IC to run at maximum speed. The circuit design topology also limits the number of devices that are exposed to high voltage. Preferably, the protection scheme is broken down into two parts: the driver and receiver. The voltage applied to the pad is clamped with Electrostatic Discharge ESD protection diodes. Nevertheless, the maximum voltage which must be sustained by the input/output buffers interface circuit for high input voltage or low internal voltage require a large DGO maximum rating.

SUMMARY OF THE INVENTION

The present invention provides a voltage switching circuitry, an integrated device and an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated for the understanding and appreciation of the underlying concepts of the present invention and in order not to obfuscate or distract from the teachings of the present invention.

Figure 1:
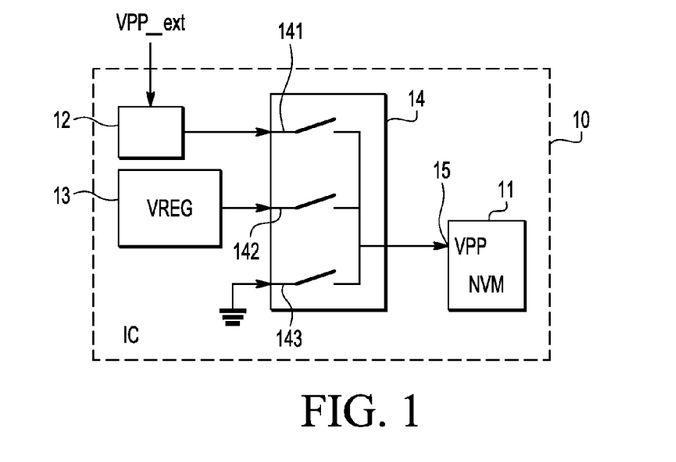
FIG. 1 schematically shows a block diagram of an example of an IC comprising a voltage switching circuit.

Referring to FIG. 1, there is shown therein a schematic block diagram of an Integrated Circuit 10 comprising a Non Volatile Memory block 11.

The circuit 10 may comprise an internal voltage regulator 13, which generates an internal low voltage supply VREG_LV, of e.g. 1.8 V. Typically, this LV supply is used for core logic and for driving LV analog functions inside the chip. In a variant, the LV supply may be received from the exterior of the IC, through a dedicated LV pad.

A function of the switching circuitry 14 is to multiplex different voltage levels (i.e., 6.5 V, 1.8 V, 0 V), which must be selectively applied on the VPP terminal of the NVM block during the various modes of operation. To this end, the switch arrangement 14 may comprise three controlled paths, namely a HV path 141, a LV path 142 and a ground path 143. The invention is in no way limited to any number of paths, which corresponds to the number of voltage levels which must be multiplexed. Indeed, advantages of the invention can be achieved as soon as one voltage level exceeding the technology max ratings must be selectively applied to a terminal of an IC.

The NVM block 11 requires a high voltage VPP_ext of e.g. 6.5 V on its VPP terminal 15 during programming. Thus, the high voltage VPP_ext is typically supplied from the exterior through a HV pad 12 of the circuit during a program mode of operation of the circuit (PROG). Such external HV supply exceeds the max rating of the MOS transistors, which is 3.6 V for the MV devices in the example of technology considered here.

Typically, the HV supply is only present on the HV pad 12 of the circuit during a NVM programming operation, namely during the PROG mode only, that is to say not permanently. When applied, the HV supply VPP_ext is selectively routed from the HV pad 12 to the VPP terminal 15 of the NVM block 11 in the circuit 10, based also on programming control signals. This switching is achieved by an appropriate switching circuitry 14, using only LV or MV technology devices. The rest of the time, the HV pad 12 is not driven externally, i.e., it is unconnected.

Typically, the NVM programming is done at final test of the ASIC manufacturing process, the high voltage being provided by the test tool (tester). On the field, the NVM is read each time the ASIC is powered-up. During a read mode of operation (READ mode), a VPP 1.8 V supply voltage must be provided to the VPP terminal 15 in order for the reading operation to be carried out. Once the reading operation is complete, the VPP terminal must be pulled to the ground potential, namely 0 V, due to the significant leakage of the NVM circuit which would otherwise exceed the specification for standby current of the ASIC. Stated otherwise, in a standby mode of operation (OFF mode), the voltage on the VPP terminal is switched to 0 V.

Figure 2:
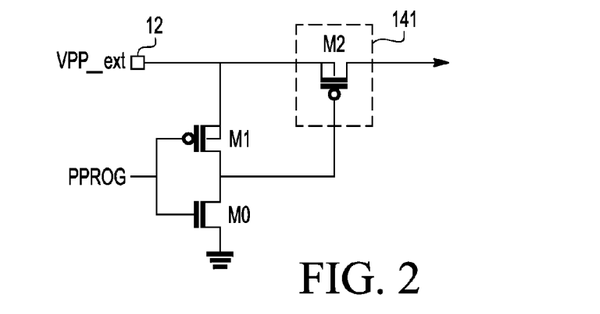
FIG. 2 schematically shows a circuit diagram of an example of an implementation of a high voltage switching circuitry using devices out of their SOA.

For switching, for instance, the HV supply VPP_ext to the VPP terminal of the NVM, one may think of designing a selectively switchable HV supply path 141 as shown in FIG. 2.

The HV supply path 141 may indeed comprise a quite simple switch, namely a PMOS transistor M2 in series between the HV pad 12 and the switch output. The latter can, in turn, be coupled to the VPP terminal 16 of the NVM and to other internal terminal depending on the application. The switch M2 can be controlled by a MOS inverter, which conventionally comprises a PMOS transistor M1 and a NMOS transistor M0, the latter being stronger than M1 that is to say with a wider channel region. This inverter M0, M1 is arranged for selectively controlling the opening and closing of the switch M2, depending on the logical state of a program control signal PPROG applied on its input.

During a programming operation (PROG mode), a 6.5 V voltage may be applied on the pad 12, and the HV supply path 141 may be switched OFF by turning the PPROG signal to the inactive state, for instance 0 V in the case of a positive logic, until the effective programming is started. Thus, the VGS voltage of M1 equals 6.5 V which exceeds its VGSmax rating. Similarly, the VDS voltage of M0 equals 6.5 V which exceeds its VDSmax rating.

When the HV supply path is switched ON to effectively program the NVM, the inverter input is turned to 1.8 V. Since M0 is stronger than M1, the output of the inverter is driven to approximately 0 V. Thus, the VGS voltage of M1 equals 6.5−1.8=4.7 V, which still exceeds its VGSmax rating. Similarly, its VDS voltage equals 6.5 V which also is above its VDSmax rating. Finally, the VGS voltage of M0 equals 6.5 V, which exceeds its VGSmax rating.

Stated otherwise, the DGO MOS transistors of the arrangement of FIG. 2 would be submitted to overvoltage conditions which would result in damages in initial NVM programming, causing permanent leakage. According to embodiments, on the contrary, there is proposed a voltage switching circuitry arrangement which, while using DGO MOS rated 3.6V, avoids over-stressing the transistors.

Figure 3:
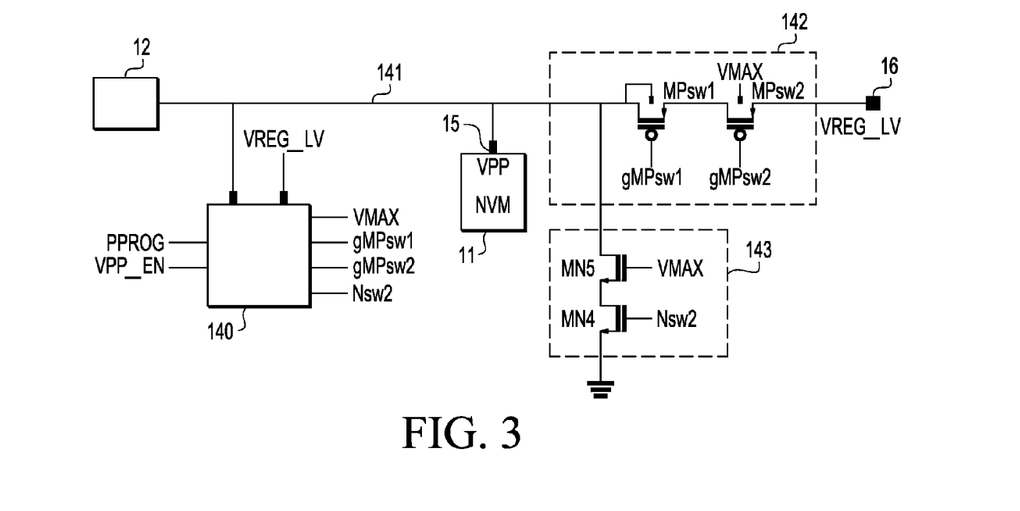
FIG. 3 schematically shows a circuit diagram of an example of an embodiment of a voltage switching circuitry.

For example, referring to FIG. 3, the circuitry comprises the HV path 141 between pad 12 and terminal 15, the LV path 142 between a terminal 16 receiving the LV supply VREG_LV, and the ground path 143 between terminal 15 and the ground. The circuitry further includes a switch control unit 140 adapted to generate switch control signals controlling switch arrangements comprised in at least some of the paths 141, 142 and 143. Embodiments of the paths 141, 142 and 143 of the switching circuitry 140 will now be presented in further details.

The HV path 141 may comprise a direct connection between the HV pad 12 of the IC and the VPP terminal 15 of the NVM block 11. As previously mentioned, indeed, the pad 12 may receive the HV supply voltage VPP_ext, for instance from the exterior, in a non permanent manner. Thus, this HV path is ON when the HV supply VPP_ext is applied on the pad 12, and is OFF the rest of the time. In other words, this path is switched ON or OFF by the application or non application, respectively, of the HV supply VPP_ext on pad 12. This application or non application may be controlled from the exterior of the IC, typically by a tester as mentioned above.

In operation, the HV path in ON during the PROG mode only, when both a VPP enable signal VPP_EN and the above mentioned PPROG signal are active. It is OFF the rest of the time.

Such direct connection between the HV pad and the VPP terminal of the NVM block provides, among others, the advantage that a series switch is avoided. This minimizes the ohmic losses under the HV supply, and ensures that the NVM supply is tightly regulated during the programming. Hence, NVM programming efficiency may be optimized by simply controlling the duration of the programming, yielding in enhanced data retention characteristics.

Alternatively, a switch arrangement could be inserted in the HV path, between the HV pad 12 and the VPP terminal 15 of the NVM block 11. In that case, such switch arrangement would be designed and controlled as the switch arrangements of the LV path and the ground path described below.

The LV path 142 may comprise a first switch arrangement with a given number N of MOS transistors in series between the VPP terminal 15 of the NVM block 11 and the terminal 16 receiving the LV supply VREG_LV. Terminal 16 may be internal to the circuit. For instance, terminal 16 is the output terminal of the voltage regulator 13, or is coupled thereto. In a variant, terminal 16 may correspond to a pad receiving the low voltage VREG_LV from the exterior. In the described embodiments, the LV supply VREG_LV may be permanently applied to terminal 16. If alternative embodiments, it may not be permanently applied, in particular if the reading voltage is received from the exterior of the IC.

The transistors of this first switch arrangement may e.g. PMOS transistors. This avoids using a Charge Pump, and thus minimizes the die size, current consumption and noise.

In operation, the LV path in ON during the READ mode only, when VPP_EN is active and PPROG is inactive. It is OFF the rest of the time.

The ground path 143 similarly comprises a second switch arrangement with N transistors in series between the VPP terminal 15 of the NVM block 11 and a ground terminal. The transistors of this second switch arrangement may e.g. be NMOS transistors.

In operation, the ground path in ON during the OFF mode only, when both VPP_EN and PROG are inactive. It is OFF the rest of the time.

The number N is at least equal to 2. In the example shown, N is equal to 2, so the switch arrangement of path 142 comprises a first transistor MPsw1 and a second transistor MPsw2 in series between terminal 15 and terminal 16, and the switch arrangement of path 143 comprises a first transistor MN4 and a second transistor MN5 between terminal 15 and the ground. As will be explained in further details below, N is chosen depending on the maximum voltage level which must be sustained by the IC (which typically is the HV supply VPP-ext), and on the technology voltage max ratings for the transistor devices of the IC.

The switch control unit 140 is typically supplied by the low voltage supply voltage VREG_LV. It receives input control signals including the aforementioned program control signal PPROG and VPP enable signal VPP_EN, the combination of which determines the mode of operation of the circuit. In embodiments, signals VPP_EN and PPROG are active in the high state under the LV supply. Assuming a positive logic is used, these signals are thus active when at VREG_LV, and are inactive when at 0 V.

The VPP enable signal is active during the time when the VPP_ext supply voltage is applied on the HV pad 12, that is to say during the PROG mode of operation of the IC (irrespective of whether a programming operation is in progress or not, which is driven by the state of PPROG). It is also active during the READ mode when the LV supply VREG-LV must be applied on the VPP terminal 15 of the NVM. It is inactive the rest of the time.

The program control signal PPROG is active during an effective program operation only, within the time the IC is in the PROG mode. It is inactive the rest of the time.

From a functional standpoint, the switch control unit 140 outputs control signals for the series transistors of the switch arrangement of path 141, including a signal gMPsw1 for controlling transistor MPsw1 and a signal gMPsw2 for controlling transistor MPsw2, as well as a control signal Nsw2 for controlling the transistor MN4 of the ground path 143. Finally, it generates a voltage VMAX which shall be presented below, and which is used as a control signal for the cascode transistor MN5 of the switch arrangement of the ground path 143.

Figure 4:
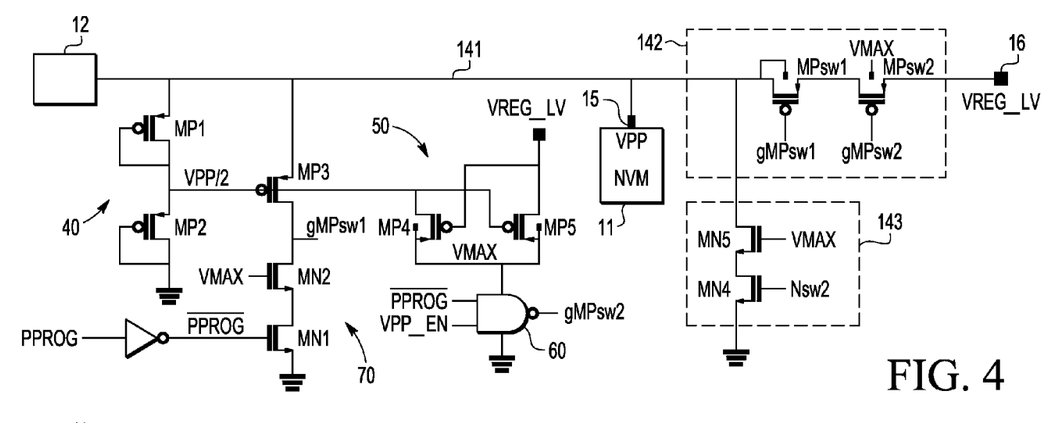
FIG. 4 schematically shows a circuit diagram of shows further an example of an embodiment of a control unit of the voltage switching circuitry of FIG. 3.

With reference now to FIG. 4, and from a structural standpoint, the switch control unit 140 comprises a voltage-by-N divider having N−1 output taps. This voltage divider 40 is arranged to divide the HV supply VPP_ext by N down to an intermediate voltage level below the max rating of the MOS transistors. In other words, N may be chosen by the ASIC designer so that the scaled down version VPP_ext/N of the HV supply is below the technology max ratings.

In the example of FIG. 4, N is equal to 2. The divider 40 may thus comprise two diode-connected PMOS transistors MP1 and MP2 arranged in series between the pad 12 and the ground terminal. Alternatively, the diodes may be replaced by resistors arranged in a resistor bridge, but diodes have a less die impact.

The intermediate voltage level VPP/2 corresponds to substantially the half of the level of the HV supply VPP_ext, assuming that transistors MP1 and MP2 are substantially of the same size, which is not mandatory. VPP/2 is given by the voltage at the tap which corresponds to the node between transistors MP1 and MP2.

For higher values of N, a corresponding number of N such diode-connected transistors may be similarly arranged in series between pad 12 and the ground terminal. The N−1 taps of the voltage divider output respective intermediate voltage levels staged below the HV supply VPP_ext, and the least of these levels, namely VPP/N, is always less that the technology max ratings of the MOS devices. VPP/N is called a scaled down version of the HV supply VPP_ext.

A voltage level below the technology max ratings of the MOS devices could be obtained in a different manner, for instance by substracting constant voltage drops from VPP_ext. However, using a voltage divider provides optimal operating points for protecting transistors, independently of technological parameter values (e.g. VTH, VGS, etc.) of the devices used to obtained VPP/N. This voltage tracking method also improves the tolerance against VPP_ext variations.

The switch control unit 140 further comprises a max voltage generator 50, generating the aforementioned voltage VMAX which corresponds to the maximum of the LV supply VREG_LV and the intermediate voltage VPP/2 output by the voltage divider 40. For example, this max generator may comprise a pair of cross-connected PMOS transistors MP4 and MP5. More precisely, the gate of MP4 and the drain of MP5 may receive the LV supply VREG_LV while the gate of MP5 and the drain of MP4 receive the intermediate voltage VPP/2. The respective sources of MP4 and MP5 are connected together and these common source outputs the VMAX voltage. Bulks of MP4 and MP5 may also be connected together at the common source node, which avoids reverse current conduction.

As it has already become apparent to those skilled in the art, the voltage VMAX shall correspond to the HV supply VPP_ext divided by two during the PROG mode, and to the LV supply VREG_LV in the READ mod and in the OFF mode. Stated otherwise, VMAX corresponds to the highest of the LV supply and the scaled down version of the HV supply when the latter is available in the circuit and, such in the latter case, VMAX is below the technology max ratings of the MOS devices.

The voltage VMAX is used to generate staged control signals for the switch arrangements of the LV path 142 and the ground path 143, as will be explained in what follows.

As regards the LV path 142, the switch control unit 140 comprises a first logic 60 generating the control signal gMPsw2 which drives the gate of PMOS transistor MPsw2 of the LV path 142. This control signal is active low in the READ mode, and inactive in the PROG mode and the OFF mode. Advantageously, the logic 60 is supplied by the VMAX voltage, so that its inactive high voltage level corresponds to VMAX. In one example, this logic comprises a NAND gate, which receives the signal VPP_EN and the logical inverse of signal PPROG as inputs, and generates outputs the control signal gMPsw2.

The switch control unit 140 comprises a second logic 70 generating the control signal gMPsw1 which drives the gate of the other PMOS transistor, namely MPsw1, of the LV path 142. This control signal is active low in the READ mode and the OFF mode, and inactive in the PROG mode.

In one embodiment, the logic 70 comprises a branch between the pad 12 and the ground terminal, with a NMOS transistor MN1 located close to the ground terminal, another NMOS transistor MN2 whose source is coupled the drain of MN1 and whose drain is coupled to the pad 12 through a PMOS transistor MP3. The gate of MN1 is driven by the logical inverse of PPROG, and thus MN1 is switched under the LV supply VREG_LV. The gate of MN2 is driven by VMAX, so that MN2 operates as a cascode transistor protecting the transistor MN1 in the PROG mode. The control signal gMPsw1 is taken on the drain of MN2. The gate of MP3 is driven by the scaled down version VPP/2 of the HV supply VPP_ext, so that MP3 operates as a pull-up transistor. In the PROG mode, the source voltage of MN2 settles close to VPP_ext/2.

Briefly summarized, the second logic 70 translates the PPROG signal from the [0,VREG_LV] range to the higher [0,VPP_ext] range.

The voltage VMAX is applied to the bulk of MPsw2, and the bulk of MPsw1 can be coupled to its drain. These transistors being symmetric, their drain and source can be exchanged freely. Connecting the bulk of MPsw1 to pad 12 provides the advantage that current conduction is prevented when the HV supply is present at pad 12 and at gMPsw1 (and MPsw1 is open).

As regards the ground path 143, finally, the gate of transistor MN5 is driven by the voltage VMAX, and the gate of MN4 is driven by a control signal Nsw2 which is active high, under the LV supply VREG_LV, in the OFF mode only. Control signal Nsw2 may be asserted by control unit 140 when entering into the OFF mode is driven. Thus, MN5 operates as a cascode transistor protecting the transistor MN4 in the PROG mode. In this mode, its source voltage settles close to VPP_ext/2.

Table 1 below summarizes the voltage levels of the control signals which drive the operation of the switching circuitry in the above described embodiments, in any one of the PROG mode, READ mode and OFF mode. The mode of operation may be determined by the combination of the logic values of signals VPP_EN and PPROG. For better clarity and conciseness, only their logical value is indicated in the table.

Figure 5:
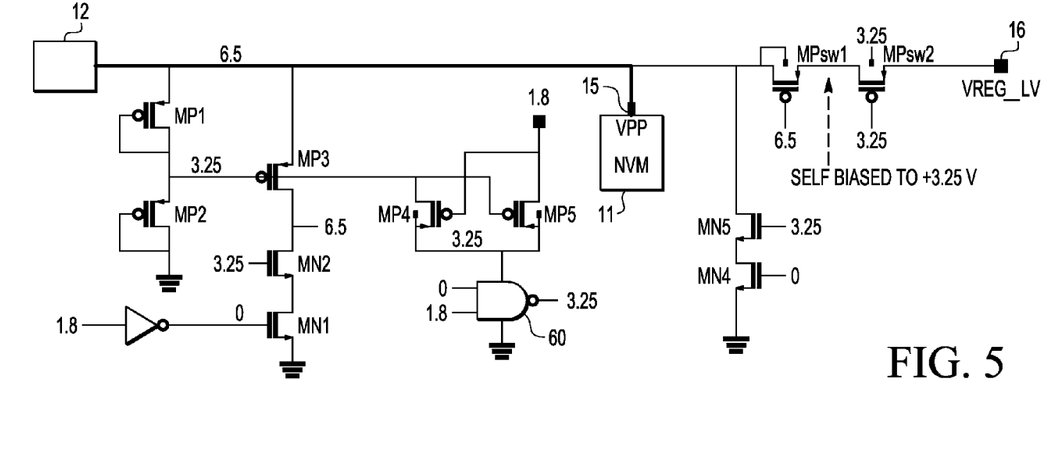
FIG. 5 illustrates the operation of the example of FIG. 4 in a NVM program mode.

With reference to FIG. 5, in the PROG mode, the source voltage of MPsw1 (i.e., the drain of MPsw2) settles close to VPP_ext/2. Any higher voltage would turn on MPsw2 which would make the voltage drop as MPsw1 is switched OFF. The source voltage of both MN2 and MN5 settles close to VPP_ext/2, thus protecting switches MN1 and MN4, respectively.

As can be seen, the max voltage ratings of the MOS transistors are not exceeded even during the PROG mode. In particular, the voltage drop from the HV pad 12 to the LV supply terminal 16 is optimally distributed between the two series PMOS transistors MPsw1 and MPsw2 of the LV path 142. This is achieved by adequate gate drive signals provided by the switch control unit 140. Thus, it is ensured that the SOA of these PMOS transistors is not violated.

Also, the pull-down NMOS transistor MN4 is effectively protected against overvoltage thanks to the cascode NMOS transistor MN5 which is controlled by the switch control unit 140 to divide equally the voltage drop across the two NMOS transistors of the ground path 143.

Figure 8:
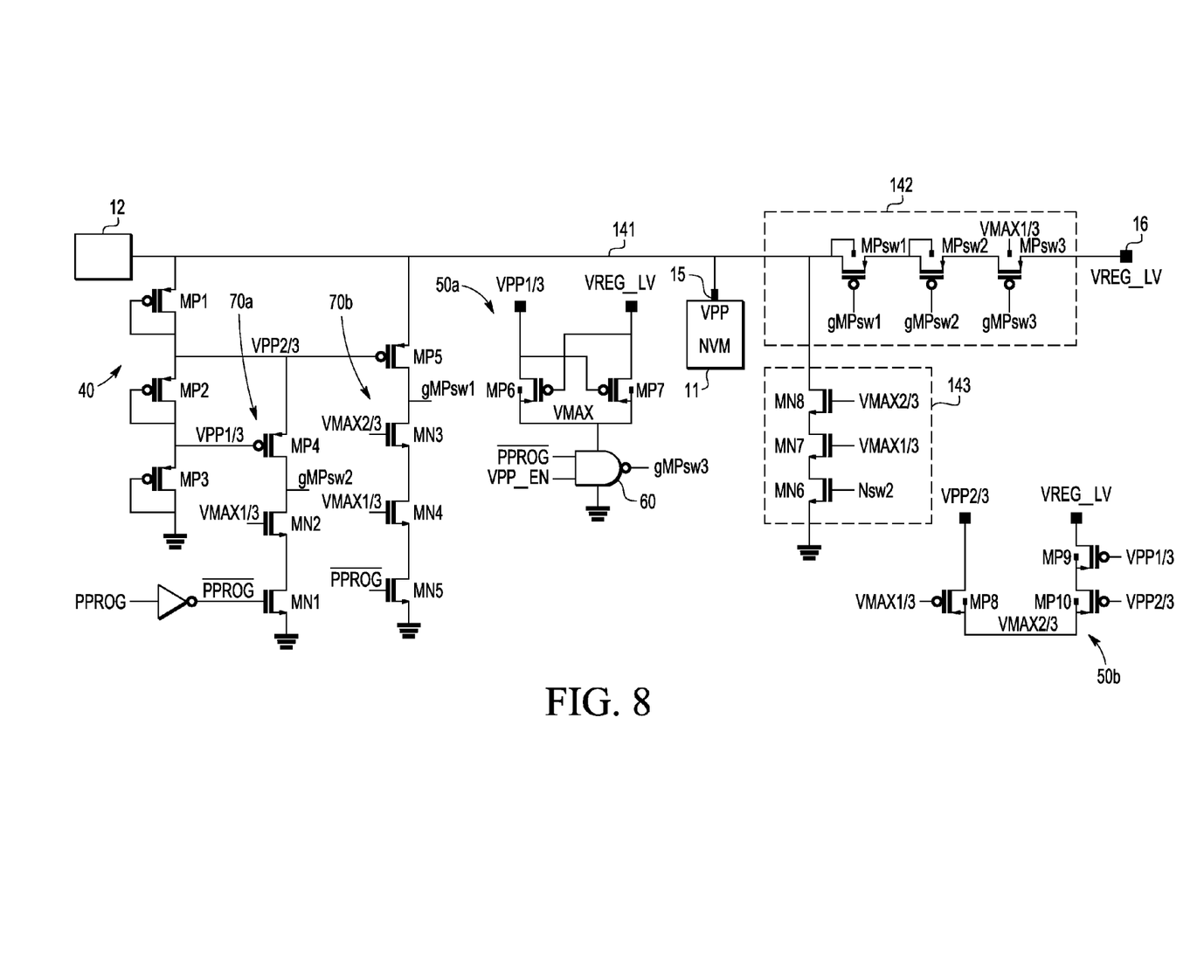
FIG. 8 schematically shows a circuit diagram of another example of an embodiment of a voltage switching circuitry; and, FIG. 9 illustrates the operation of the circuitry of FIG. 8 in a standby mode.

FIG. 8 shows another embodiment of a voltage switching circuitry, which illustrates that the proposed topology is easily scalable to handle either higher VPP voltage or lower max ratings of transistors.

In the example considered here, the transistors used are of the same technology as in the embodiments hereinbefore described with reference to FIGS. 2 to 7, namely transistors with still max ratings of 3.6 V. However, the HV supply and LV supply are 10.5 V and 1.8 V, respectively. Stated otherwise, the high voltage is significantly higher than in the embodiments previously considered, which would result in the transistors of the circuitry of FIG. 4 being submitted to overvoltages. Therefore, the original topology is stretched further.

As regards the LV path, for instance, the voltage drop between VPP_ext and VREG_LV is distributed among more series PMOS transistors, namely three transistors (N=3, where N designates the number of transistors in the switching arrangement of the LV path). More spaced taps of the VPP divider are used to obtained the intermediate voltages used to generate the switch control signals, namely two (or N−1) taps. Finally, more max voltage generators may be used, namely one more max voltage generator here (so that there are N−1 generators in total).

Using a generic terminology based on the number N of MOS transistors (i.e., switches) which are necessary to substantially equitably share between said transistors the voltage drop between terminal 15 and terminal 16 in the PROG mode (in the example considered here), then the following features of the voltage switching circuitry are proposed:

TABLE 1

| Mode | VPP_EN | PPROG | VPP | gMPsw1 | gMPsw2 | Nsw2 | VMAX | VPP/2 |
|---|---|---|---|---|---|---|---|---|
| PROG | 1 | 1 | VPP_ext | VPP_ext | VPP_ext/2 | 0 | VPP_ext/2 | VPP_ext/2 |
| READ | 1 | 0 | VREG_LV | 0 | 0 | 0 | VREG_LV | VREG_LV/2 |
| OFF | 0 | 0 | 0 | 0 | VREG_LV | VREG_LV | VREG_LV | ~0 |

Figure 6:
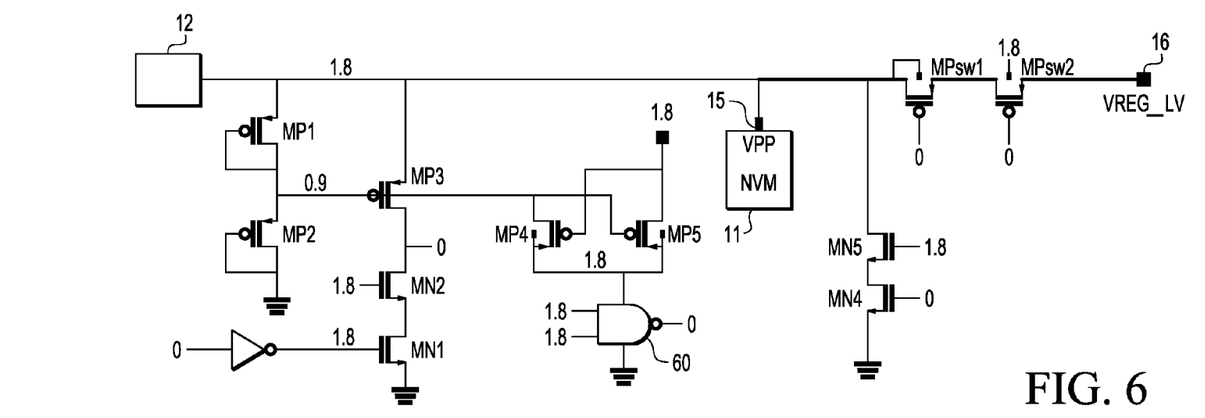
FIG. 6 illustrates the operation of the example of FIG. 4 in a NVM read mode.
Figure 7:
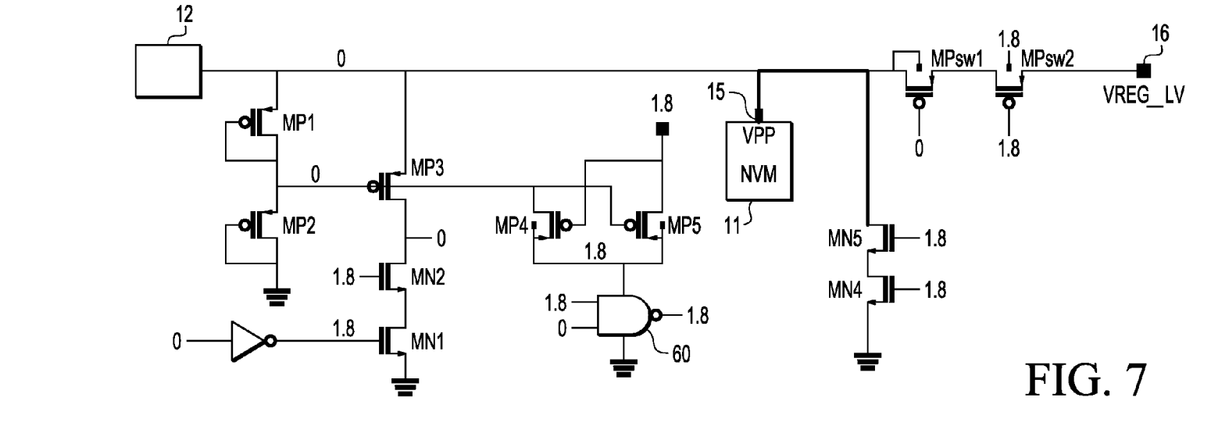
FIG. 7 illustrates the operation of the example of FIG. 4 in a NVM off mode.

FIGS. 5, 6 and 7 illustrate the operation of the circuitry of FIG. 4 in the PROG mode, READ mode, and OFF mode, respectively. In these Figures, the numeric values indicated at some electric nodes are those of the voltage at said nodes, in one example where the HV supply and LV supply are 6.5 V and 1.8 V, respectively. Besides, the selected path is shown in bold.

the voltage switching arrangement 142 which is associated to the LV supply to be multiplexed on the terminal 15, comprises N switches MPsw1, MPsw2, and MPsw3 in series between terminal 15 receiving the VPP_ext voltage (in the PROG mode) and terminal 16 receiving voltage VREG_LV (permanently in the example). Knowing that the voltage level of VPP_ext is higher than the voltage level of VREG_LV, the voltage drop VPP_ext−VREG_LV is shared between the N switches, where N is at least equal to 2 (N=3 in the example of FIG. 8);

the voltage divider 40, which is a voltage-by-N divider, has N−1 output taps, arranged to divide voltage VPP_ext by N to a scaled down version of VPP_ext having a voltage level (VPP1/3 in the example of FIG. 8) below voltage max ratings of the switches; the N−1 output taps of the divider are arranged to respectively output N−1 intermediate voltages having respective levels (VPP1/3 and VPP2/3 in the example of FIG. 8) staged below VPP_ext;

N−1 max voltage generators (50a and 50b in the example of FIG. 8) generate N−1 internal supply voltages (VMAX1/3 and VMAX2/3 in the example of FIG. 8), respectively equal to the maximum of VREG_LV and of each of the N−1 intermediate voltages (VPP1/3 and VPP2/3 in the example of FIG. 8); these N−1 internal supply voltages are used by the switch control unit 140 for generating the N control signals of the N switches of the switching arrangement 142; and, the switch control unit 140 generates N control signals using the N−1 internal supply voltages, said N control signals having respective voltage levels staged between the voltage level of VPP_ext and the voltage level of VREG_LV, and each of said N control signals controlling one of the switches of the switching arrangement 142, respectively.

Comparing the embodiments of FIGS. 4 and 8 reveals that the voltage divider 40 of FIG. 8 comprises 3 series diode-connected PMOS transistors, namely MP1, MP2 and PM3, instead of two such diodes only in the embodiment of FIG. 4. The VPP1/3 intermediate voltage, which corresponds to the scaled down version of VPP_ext, is given by the source of the diode, namely MP3, which is the closest to the ground terminal. The level of VPP1/3 corresponds to one third of the level of VPP_ext. The other tap, namely the source of MP2, delivers the VPP2/3 intermediate voltage, whose level corresponds to two thirds of VPP_ext.

Some straightforward variations in the design of the control unit 140 have to be considered, compared with the embodiment of FIG. 4.

It shall thus be noted that the single branch of logic 70 of FIG. 4 is replaced by two branches 70a and 70b in the embodiment of FIG. 8.

The first branch 70a comprises NMOs transistors MN1 and MN2, exactly as branch 70 of FIG. 4. However, the pull-up PMOS transistor MP4 received the intermediate voltage VPP2/3 on its source, not VPP_ext like transistor MP3 of FIG. 4. The gate of MN2 is driven by voltage VMAX 1/3 (see below). The control signal gMPsw2 which controls transistor MPsw2 of the switch arrangement 142, is taken on the drain of the cascode transistor MN2.

The second branch 70b comprises a NMOS transistor MN5, cascoded by two protecting NMOS transistors MN4 and MN3, which are pull-up to VPP_ext by a PMOS transistor MP5. The gate of MN5, as for MN1 of branch 70a, is driven by the logical inverse of PPROG. The gates of MN4 and MN3 are driven by VMAX1/3 and VMAX2/3, respectively. Finally, the gate of MP5 is driven by VPP2/3. The control signal gMPsw1 which controls transistor MPsw1 of the switch arrangement 142, is taken on the drain of the second cascode transistor MN3 of the branch.

The control signal gMPsw3 which controls transistor MPsw3 of the switch arrangement 142, is still output by the logic 60 (structurally unmodified), but the latter being supplied by VMAX1/3.

It shall further be noted that the max voltage generator 50a of FIG. 8 comprises transistors MP6 and MP7 which replace transistors MP4 and MP5, respectively, of the max voltage generator 50 of FIG. 4. Besides, the drain of MP6 (and gate of MP7) receives the VPP1/3 intermediate voltage. Generator 50a outputs a voltage VMAX1/3 which is the maximum of VPP1/3 and VREG_LV.

Still further, it shall be noted that the additional max voltage generator 50b of FIG. 8 is not strictly identical with the max voltage generator 50 of FIG. 4, but can easily be derived there from by the one with ordinary skills in the art. With reference to FIG. 8, for instance, the additional max voltage generator 50b comprises a pair of common source PMOS transistors MP8 and MP10. The gate of MP8 is driven by VMAX1/3, and its drain is at VPP2/3. The gate of MP10 is driven by VPP2/3, and its drain receives VREG_LV through another PMOS transistor PM9, whose gate is driven by VPP1/3. Generator 50b outputs a voltage VMAX2/3 which is the maximum of VPP2/3 and VREG_LV.

Figure 9:
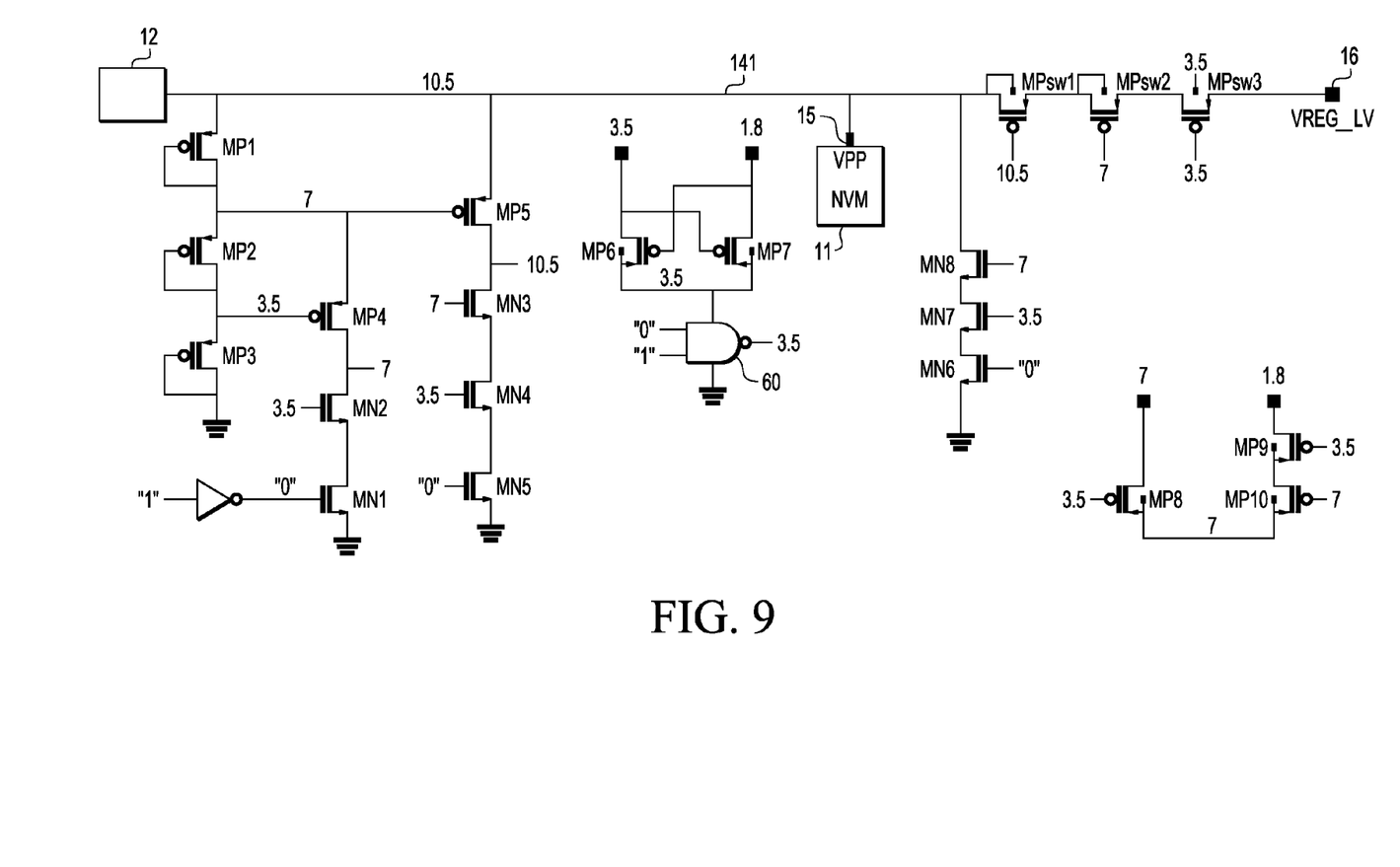

FIG. 9 illustrates the operation of the circuitry of FIG. 8 in a NVM program mode (PROG mode). The numeric values indicated at some electric nodes are those of the voltage at said nodes. As can be seen, even when transistors are used which are of the same technology as in the embodiments hereinbefore described with reference to FIGS. 2 to 7, namely transistors with max ratings of 3.6 V, the proposed topology ensures that none of the transistors is used out of its SOA.

The various examples hereinbefore described and illustrated in the accompanying drawings may provide at least one of the following:

(i) Use of standard Low Voltage technology for Mixed-signal ICs embedding switches or multiplexers for routing excessive (with respect to the technology ratings) High Voltage signals or supplies to pads or IC blocks, thus avoiding an expensive High Voltage technology (for which extra process steps are required);

(ii) high reliability since the devices are used in their SOAs;

(iii) use of standard PDK;

(iv) operation of the switches or multiplexers under a High Voltage supply for unlimited time as the transistor maximum voltage ratings are not exceeded;

(v) simplicity and compactness, with minimum die size impact (no use of bulky resistors, capacitors, Zener diodes, bipolar transistors, or HV complex MOS transistors)

(vi) scalability of the circuitry, which makes use possible for different functions (with different HV levels) or different technologies (with different max ratings for the devices); and, (vii) no need for a charge pump.

In the foregoing specification, the invention has been described with reference to specific examples of embodiments of the invention. It will, however, be evident that various modifications and changes may be made therein without departing from the invention as set forth in the appended claims, which shall not be construed as being limited to the examples described in the herein above.

For example, the voltage switching circuitry may be used to route HV signals or supplies, using only LV and/or MV transistor devices available in standard PDKs, with no limitation on time and without over-stressing the transistors. As an example, such circuitry may use the PDK of the 0.18 um Mixed-Signal semiconductor technology as used by TSMC, which offers 1.8V rated DGO MOS transistors (LV technology) and 3.6V rated DGO MOS transistors (MV technology). Of course, it is noted that the invention is not in any way intended to be limited to this technology, or to technologies of those specific maximum ratings.

Similarly, though embodiments of the invention will be described in their application to an IC requiring HV supply for NVM programming, it will be understood that the teachings of the present invention encompass any other suitable application, and that the invention can be used each time a low voltage module has to be switched from a low voltage to a high voltage and one of these voltages exceeds the technology max ratings. Furthermore, the IC may be a sensor Application Specific Integrated Circuit (ASIC), for example a consumer 3-Axis accelerometer or a magnetic sensor (Magnetometer). Such ASIC may comprise a NVM for storing parameters or other permanent data of that kind. However, other types of IC's may also be used.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the max voltage generator 50 may be reused for another similar switching circuitry inside the same IC, for multiplexing different voltages at another inside terminal for another function. Also at least part of the control unit 140 may be included in a larger logic block, pertaining to additional functions as well.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, an internal High Voltage source could be provided in a HV domain of the IC which would be designed using HV technology. Alternatively, the examples may be implemented as any number of separate integrated circuits or separate devices interconnected with each other in a suitable manner. For example, the internal Low Voltage source 13 could be replaced by a dedicated LV pad which may receive the LV supply from the exterior of the IC.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A voltage switching circuitry comprising:
    at least one switching arrangement with a given number, N, of switches in series between a first terminal for receiving a first voltage at a first voltage level and a second terminal for receiving a second voltage at a second voltage level, the first voltage level being higher than the second voltage level, and N being at least equal to 2;
    a voltage-by-N divider having N−1 output taps, arranged to divide the first voltage by N to a scaled down version of the first voltage having a voltage level below voltage max ratings of the switches, wherein the N−1 output taps of the divider are arranged to respectively output N−1 third voltages having respective levels staged below the first voltage level;

N−1 max voltage generators for generating N−1 fourth voltages, respectively equal to the maximum of the second supply voltage and of each of the N−1 third voltages; and a switch control unit for generating N control signals using the N−1 fourth voltages, said N control signals having respective voltage levels staged between the first voltage level and the second voltage level, and each of said N control signals controlling one of the switches of the switching arrangement, respectively.

2. The voltage switching circuitry of claim 1, wherein the switches are PMOS transistors.

3. The voltage switching circuitry of claim 1, wherein the voltage-by-N divider comprises N diode-connected MOS transistors in series between a terminal at the first voltage and a terminal at the potential of the ground.

4. The voltage switching circuitry of claim 2, wherein the voltage-by-N divider comprises N diode-connected MOS transistors in series between a terminal at the first voltage and a terminal at the potential of the ground.

5. An integrated circuit device comprising:
a first terminal for receiving a first voltage at a first voltage level;
a second terminal for receiving a second voltage at a second voltage level, the first voltage level being higher than the second voltage level; and
a voltage switching circuitry of claim 1.

6. The integrated device of claim 5, comprising a second switching arrangement with N switches in series between the first terminal and a third terminal for receiving a third voltage at a third voltage level, where the first voltage level is higher than the third voltage level, wherein N second control signals controlling the switches of the second switching arrangement are further generated by the switch control unit using the N−1 fourth voltages, said N second control signals having respective voltage levels staged between the first voltage level and the third voltage level.

7. The integrated device of claim 6, wherein the third terminal is a ground terminal, and wherein the switches of the second switching arrangements are NMOS transistors.

8. The integrated device of claim 6, wherein the voltage-by-N divider comprises N diode-connected MOS transistors in series between a terminal at the first voltage and a terminal at the ground potential.

9. The integrated device of claim 5, wherein the switches of the first switching arrangement are PMOS transistors.

10. The integrated device of claim 9, wherein the third terminal is a ground terminal, and wherein the switches of the second switching arrangements are NMOS transistors.

11. The integrated device of claim 9, wherein the voltage-by-N divider comprises N diode-connected MOS transistors in series between a terminal at the first voltage and a terminal at the ground potential.

12. The integrated device of claim 5, wherein the voltage-by-N divider comprises N diode-connected MOS transistors in series between a terminal at the first voltage and a terminal at the ground potential.

13. An integrated circuit comprising:
a Non Volatile Memory block having an input terminal on which a first voltage at a first voltage level or a second voltage at a second voltage level may be applied, where the first voltage level is higher than the second voltage level;
a voltage source having an output terminal delivering the second voltage;
a pad which may receive the first voltage from the exterior of the circuit and which is directly connected to the input terminal of the Non Volatile Memory block; and
a voltage switching circuitry comprising:
a first switching arrangement with a given number N of switches in series between the input terminal of the Non Volatile Memory block and the pad, where N is at least equal to 2;
a second switching arrangement with N switches in series between the input terminal of the Non Volatile Memory block and a ground terminal;
a voltage-by-N divider, having N−1 output taps, arranged to divide the first voltage by N to a scaled down version of the first voltage having a voltage level below voltage max ratings of the switches, wherein the N−1 output taps of the divider are arranged to respectively output N−1 third voltages having respective levels staged below the first voltage level;
N−1 max voltage generators for generating N−1 fourth voltages, respectively equal to the maximum of the second voltage and of each of the N−1 third voltages;
a switch control unit for generating N first control signals using the N−1 fourth voltages, said N first control signals having respective voltage levels staged between the first voltage and the second voltage, each of said N first control signals controlling one of the switches of the first switching arrangement, respectively; and,
N second control signals using the N−1 fourth voltages, said N second control signals having respective voltage levels staged between the first voltage and the third voltage, each of said N second control signals controlling one of the switches of the second switching arrangement, respectively.

14. The integrated circuit of claim 13, wherein the switches of the first switching arrangement are PMOS transistors.

15. The integrated circuit of claim 14, wherein the switches of the second switching arrangements are NMOS transistors.

16. The integrated device of claim 14, wherein the voltage-by-N divider comprises N diode-connected MOS transistors in series between the pad and the ground terminal.

17. The integrated circuit of claim 13, wherein the switches of the second switching arrangements are NMOS transistors.

18. The integrated device of claim 13, wherein the voltage-by-N divider comprises N diode-connected MOS transistors in series between the pad and the ground terminal.

19. A method of managing voltage switching between a first terminal receiving a first voltage at a first voltage level and a second terminal receiving a second voltage at a second voltage level, where the first voltage level is higher than the second voltage level, comprising:
dividing the first voltage by a given number N, where N is at least equal to 2, to a scaled down version of the first voltage having a voltage level below voltage max ratings of available switches, and generating N−1 third voltages having respective levels staged below the first voltage level;
generating N−1 fourth voltages, respectively equal to the maximum of the second voltage and of each of the N−1 third voltages, respectively;
generating N first control signals using the N−1 fourth voltages, said N first control signals having respective voltage levels staged between the first voltage level and the second voltage level, and; and,
controlling at least a first switching arrangement with N switches in series between the first terminal and the second terminal, each one of the switches of said first switching arrangement being controlled by one of the N first control signals, respectively.

20. The method of claim 19, further comprising:

generating N second control signals using the N−1 fourth voltages, said N second control signals having respective voltage levels staged between the first voltage level and a third voltage level, where the first voltage level is higher than the third voltage level; and, controlling a second switching arrangement with N switches in series between the first terminal and a third terminal receiving the third voltage, each one of the switches of said second switching arrangement being controlled by one of the N second control signals, respectively.

* * * * *